(12) United States Patent
Lee et al.

(10) Patent No.: US 11,770,924 B2
(45) Date of Patent: Sep. 26, 2023

(54) SEMICONDUCTOR DEVICE

(71) Applicants: UNITED MICROELECTRONICS CORP., Hsin-Chu (TW); Fujian Jinhua Integrated Circuit Co., Ltd., Quanzhou (CN)

(72) Inventors: Luo-Hsin Lee, Taoyuan (TW); Ting-Pang Chung, Taichung (TW); Shih-Han Hung, Kaohsiung (TW); Po-Han Wu, Pingtung County (TW); Shu-Yen Chan, Changhua County (TW); Shih-Fang Tzou, Tainan (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 18/106,448

(22) Filed: Feb. 6, 2023

(65) Prior Publication Data

US 2023/0189498 A1  Jun. 15, 2023

Related U.S. Application Data

(60) Continuation of application No. 17/741,431, filed on May 10, 2022, now Pat. No. 11,631,679, which is a
(Continued)

(30) Foreign Application Priority Data

Dec. 12, 2017 (CN) .......................... 201711315627.6

(51) Int. Cl.
*H10B 12/00* (2023.01)
*H01L 49/02* (2006.01)

(52) U.S. Cl.
CPC ........ *H10B 12/0387* (2023.02); *H01L 28/60* (2013.01); *H10B 12/0335* (2023.02); *H10B 12/37* (2023.02); *H10B 12/315* (2023.02)

(58) Field of Classification Search
CPC ........... H10B 12/0387; H10B 12/0335; H10B 12/37; H10B 12/315; H01L 28/60
See application file for complete search history.

(56) References Cited

U.S. PATENT DOCUMENTS 6,071,823 A  6/2000 Hung
6,100,132 A  8/2000 Sato
(Continued)

FOREIGN PATENT DOCUMENTS

CN  1518112 A  8/2004
CN  1909209 A  2/2007
(Continued)

*Primary Examiner* — Nathan W Ha
(74) *Attorney, Agent, or Firm* — Winston Hsu

(57) ABSTRACT

A method of forming a semiconductor device includes the following steps. First of all, a substrate is provided, and a dielectric layer is formed on the substrate. Then, at least one trench is formed in the dielectric layer, to partially expose a top surface of the substrate. The trench includes a discontinuous sidewall having a turning portion. Next, a first deposition process is performed, to deposit a first semiconductor layer to fill up the trench and to further cover on the top surface of the dielectric layer. Following these, the first semiconductor layer is laterally etched, to partially remove the first semiconductor layer till exposing the turning portion of the trench. Finally, a second deposition is performed, to deposit a second semiconductor layer to fill up the trench.

6 Claims, 4 Drawing Sheets

Related U.S. Application Data division of application No. 16/175,851, filed on Oct. 31, 2018, now Pat. No. 11,393,826.

(56) References Cited

U.S. PATENT DOCUMENTS

| | | |
|---|---|---|
| 6,215,187 B1 | 4/2001 | Ooto |
| 6,222,215 B1 | 4/2001 | Zahurak |
| 6,365,485 B1 | 4/2002 | Shiao |
| 9,502,298 B2 | 11/2016 | Tsai et al. |
| 9,548,228 B2 | 1/2017 | Chandrashekar et al. |
| 2003/0045119 A1 | 3/2003 | Wang |
| 2004/0140486 A1 | 7/2004 | Lee |
| 2005/0116275 A1 | 6/2005 | Lin |
| 2005/0133846 A1 | 6/2005 | Dyer |
| 2005/0148171 A1 | 7/2005 | Temmler |
| 2005/0173749 A1 | 8/2005 | Seidl |
| 2006/0057814 A1 | 3/2006 | Weis |
| 2007/0063244 A1 | 3/2007 | Ho |
| 2007/0296010 A1 | 12/2007 | Su |
| 2008/0242096 A1 | 10/2008 | Hsu |
| 2010/0144106 A1 | 6/2010 | Cho |
| 2010/0163945 A1 | 7/2010 | Kavalieros |
| 2011/0068379 A1* | 3/2011 | Koo ................ H01L 29/4236 257/E21.409 |
| 2011/0198700 A1* | 8/2011 | Park ................ H10B 12/50 257/E21.429 |
| 2011/0204429 A1 | 8/2011 | Cho |
| 2013/0062677 A1* | 3/2013 | Li ................ H01L 27/1203 438/389 |
| 2013/0113069 A1 | 5/2013 | Juengling |
| 2014/0061745 A1* | 3/2014 | Myung ............ H10B 12/482 257/532 |
| 2014/0231892 A1 | 8/2014 | Song |
| 2014/0327063 A1 | 11/2014 | Park |
| 2016/0181353 A1 | 6/2016 | Ando |
| 2016/0197083 A1* | 7/2016 | Leobandung ........ H10B 12/056 257/301 |
| 2017/0250073 A1 | 8/2017 | Ando |
| 2017/0323893 A1 | 11/2017 | Kim |
| 2017/0358581 A1 | 12/2017 | Cartier |
| 2018/0047571 A1* | 2/2018 | Hunt ................ H01L 23/16 |
| 2018/0166450 A1 | 6/2018 | Kim |
| 2018/0211961 A1 | 7/2018 | Lin |
| 2018/0269211 A1* | 9/2018 | Kim ................ H01L 28/91 |
| 2019/0206875 A1 | 7/2019 | Kim |

FOREIGN PATENT DOCUMENTS

| | | |
|---|---|---|
| CN | 103035501 A | 4/2013 |
| TW | 483112 B | 4/2002 |

* cited by examiner

SEMICONDUCTOR DEVICE

CROSS REFERENCE TO RELATED APPLICATIONS

This application is a continuation application of U.S. application Ser. No. 17/741,431, filed on May 10, 2022, which is a division of U.S. application Ser. No. 16/175,851, filed on Oct. 31, 2018. The contents of these applications are incorporated herein by reference.

BACKGROUND OF THE INVENTION

1. Field of the Invention

The present invention generally relates to the field of a semiconductor device and a forming method thereof, and more particularly to a semiconductor device having an opening with a high aspect ratio and a forming method thereof.

2. Description of the Prior Art

For years the trend in the semiconductor industry has been to scale down the size of device in order to increase the integration level and thus the current processes thereof has meet more challenge and limits thereby, for example the forming process of openings with a high aspect ratio.

Generally, processes of openings with a high aspect ratio, such as the process of storage node (SN), include firstly etching an opening with a high aspect ratio an a mask layer to expose storage node pads underneath, followed by uniformly depositing a conductive layer in the opening with a high aspect ratio, and sequentially forming a capacitor dielectric material and a capacitor top electrode on the conductive layer, after removing the mask layer. However, as the critical dimension of capacitors is getting smaller and smaller as semiconductor process technology advances, and currently deposition process is no longer adequate to provide qualified step coverage. That is, it is easy to cause defects like voids, and probably to lead to poor device performance in some serious situation.

SUMMARY OF THE INVENTION

One object of the present invention is to provide a semiconductor device and a method of forming the same, in which, the void issues caused in a depositing process of openings with a high aspect ratio in the semiconductor device are successfully improved, so as to improve the structure and the performance of the semiconductor device thereby.

To achieve the purpose described above, the present invention provides a method of forming a semiconductor device, including the following steps. First of all, a substrate is provided and a dielectric layer is formed thereon. Then, an opening is formed in the dielectric layer to expose a portion of a top surface of the substrate, and the opening comprises has a discontinuous sidewall and the discontinuous sidewalls includes a transition portion. Next, a first deposition process is performed to form a first semiconductor layer to fill up the opening and to cover a top surface of the dielectric layer, and then, a removing process is performed to laterally etch the first semiconductor layer till exposing the transition portion of the opening. Finally, a second deposition process is performed to form a second semiconductor layer to fill up the opening.

To achieve the purpose described above, the present invention provides another method of forming a semiconductor device, including the following steps. First of all, a substrate is provided and which has a dielectric layer formed thereon. Then, an opening is formed in the dielectric layer to expose a portion of a top surface of the substrate. Next, a first deposition process is performed to form a first semiconductor layer to fill up the opening and to cover a top surface of the dielectric layer, and the first semiconductor layer is partially removed till a depth of half to one third of a depth of the opening, wherein a top surface of the first semiconductor is taped inwardly from a sidewall of the opening. Finally, a second deposition process is performed to form a second semiconductor layer to fill up the opening.

To achieve the purpose described above, the present invention provides a semiconductor device, including a substrate, a dielectric, a plurality of bit lines and a plurality of plugs. The dielectric layer is disposed on the substrate, the bit lines are disposed in the dielectric layer, and the plugs are disposed in the dielectric layer, being alternately arranged with the bit lines. Each of the plugs includes a bottom portion and a top portion, the bottom portion has a bottle-shaped trench disposed therein and an opening of the bottle-shaped trench is continuously taped inwardly to a center of the bottle-shaped trench, and the top portion is disposed on the bottom portion and a part of the top portion is filled in the bottle-shaped trench of the bottom portion.

In summary, the method of the present invention mainly performs two-stepped deposition processes on openings with a high aspect ratio. Also, a v-shaped etching is further performed after the first stepped deposition process, to partially remove a semiconductor layer formed in the first stepped deposition process till a top surface of the etched semiconductor layer being lowered to a half to one third of the depth of the openings, or till a transition portion of the openings being exposed. That is, voids formed in the bottom portions of the openings will be exposed. Following these, another semiconductor layer is formed in the second stepped deposition process to fill the voids and the openings. In this way, the forming method of the present invention enables to improve the void issues which are easy to be formed during a deposition process in openings with a high aspect ratio, and to provide semiconductor device with better performance.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 5 are schematic diagrams illustrating a method of forming a semiconductor device according to a preferred embodiment of the present invention, in which:

FIG. 1 shows a cross-sectional view of a semiconductor device after forming openings;

FIG. 2 shows a cross-sectional view of a semiconductor device after performing a deposition process;

FIG. 3 shows a cross-sectional view of a semiconductor device after performing a removing process;

FIG. 4 shows a cross-sectional view of a semiconductor device after forming an oxide layer; and FIG. 5 shows a cross-sectional view of a semiconductor device after performing another deposition process.

FIG. 6 to FIG. 7 are schematic diagrams illustrating a semiconductor device being formed according to a preferred embodiment of the present invention, in which:

FIG. 6 shows a cross-sectional view of a semiconductor device after forming openings;

FIG. 7 shows a cross-sectional view of a semiconductor device after forming plugs.

DETAILED DESCRIPTION

To provide a better understanding of the present invention, preferred embodiments will be described in detail. The preferred embodiments of the present invention are illustrated in the accompanying drawings with numbered elements.

Figure 1:
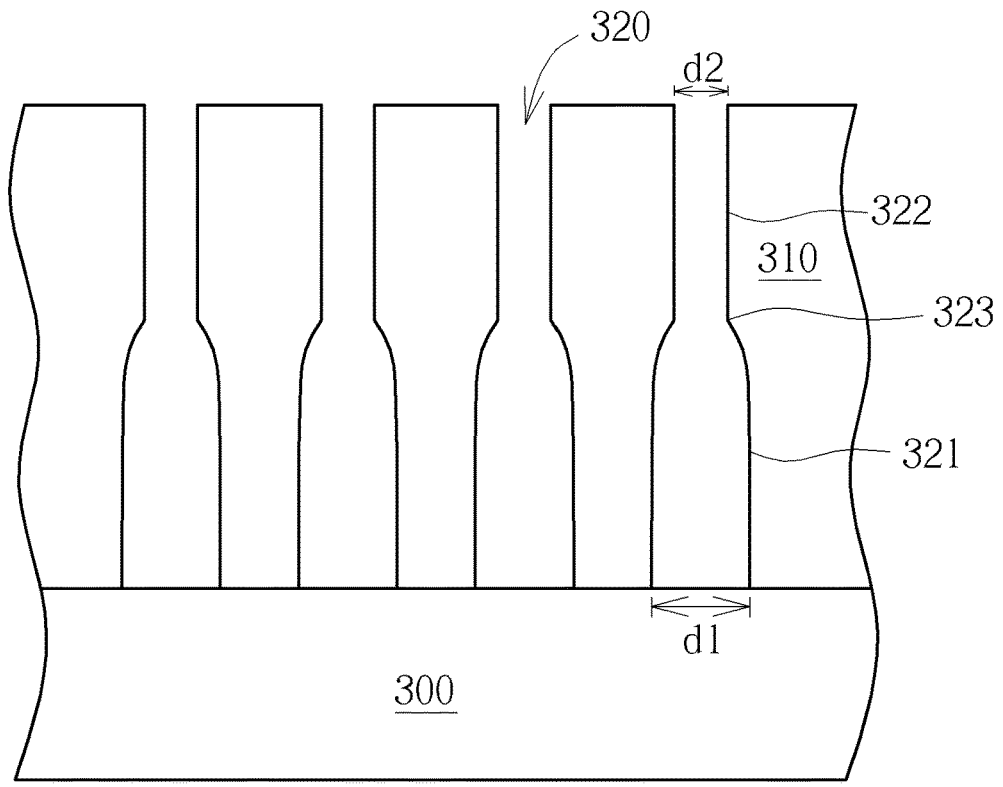

Referring to FIG. 1 to FIG. 5, FIG. 1 to FIG. 5 illustrate a forming method of semiconductor device according to a preferred embodiment of the present invention. As shown in FIG. 1, a dielectric layer 310 is firstly provided, and at least one opening such as a plurality of opening 320 as shown in FIG. 1 is formed in the dielectric layer 310. The formation of the openings 320 is for example accomplished by performing a dry etching process, but is not limited thereto. In the present embodiment, the dielectric layer 310 is formed on a substrate 300, and the openings 320 are preferably in connection with a conductive region (not shown in the drawings) in the substrate 300. Precisely, the substrate 100 may be a semiconductor substrate like a silicon substrate, an epitaxial silicon substrate or a silicon on insulator (SOI) substrate, or a non-semiconductor substrate like a glass substrate or a dielectric substrate, and the conductive region may be a doping region, a gate or a portion of a metal interconnection system like a via plug or a metal line.

It is noted that, each of the openings 320 has a high aspect ratio, such as being about 3 to 10, but not limited thereto. While forming the openings 320 through the dry etching process, a bottom portion 321 of each of the openings 320 is easy to expand due to the affection of the high aspect ratio. That is, the bottom portion 321 of each of the openings 320 formed in the present embodiment may therefore have a relative greater dimension d1 than a dimension d2 of an upper portion 322 of each of the openings 320. Also, the bottom portion 321 has an arc-shaped sidewall and the upper portion 322 has a vertical sidewall, so that, each of the openings 320 may overall performs a discontinuous sidewall with a transition portion 323 being formed between a junction of the upper portion 322 and the bottom portion 321. The transition portion 323 is formed at about half to one third of a depth of each opening 320, as shown in FIG. 1.

Figure 2:
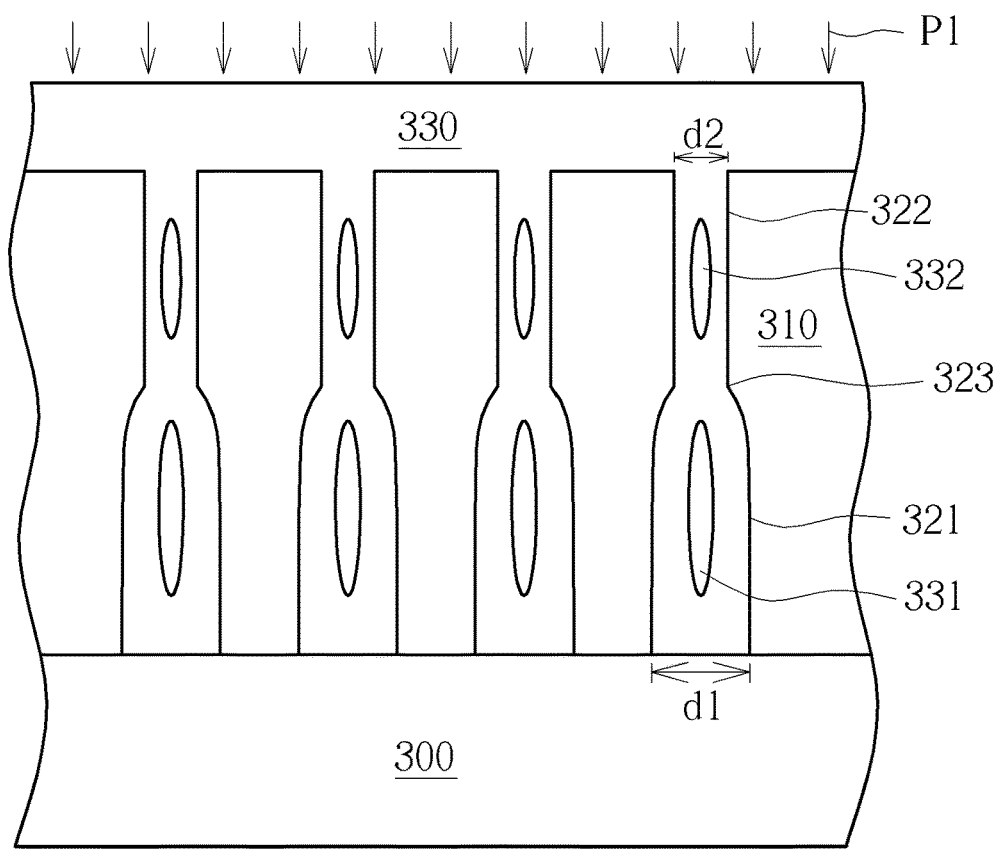

As shown in FIG. 2, a deposition process P1 for example through a low-pressure chemical vapor deposition (LPCVD) process is performed, to form a semiconductor layer 330 entirely on the dielectric layer 310, the semiconductor layer 330 may include a semiconductor material like polysilicon or amorphous silicon. In the present embodiment, the semiconductor layer 330 fills up the openings 320 and further covers a top surface of the dielectric layer 310. While performing the LPCVD process, the semiconductor material is deposited along the sidewalls of the openings 320 to form the semiconductor layer 330. However, the semiconductor material may be deposited quickly at the upper portion 322 and deposited slowly at the bottom portion 321, because the reaction gas of the LPCVD process may not efficiently enter the bottom portion 321 due to the high aspect ratio of the openings 320. Under this performance, the semiconductor layer 330 formed at the upper portion 322 is rapidly deposited to seal the openings of the openings 320, and which may further block the reaction gas from entering the bottom portion 321. Accordingly, voids 331, 332 are easily formed in the openings 320, as shown in FIG. 2. Furthermore, due to the dimension differences between the upper portion 322 and the bottom portion 321, the voids 331 formed at the bottom portion 321 are more serious, and which may include a relative greater volume than the voids 332 formed at the upper portion 322, as shown in FIG. 2.

Figure 3:
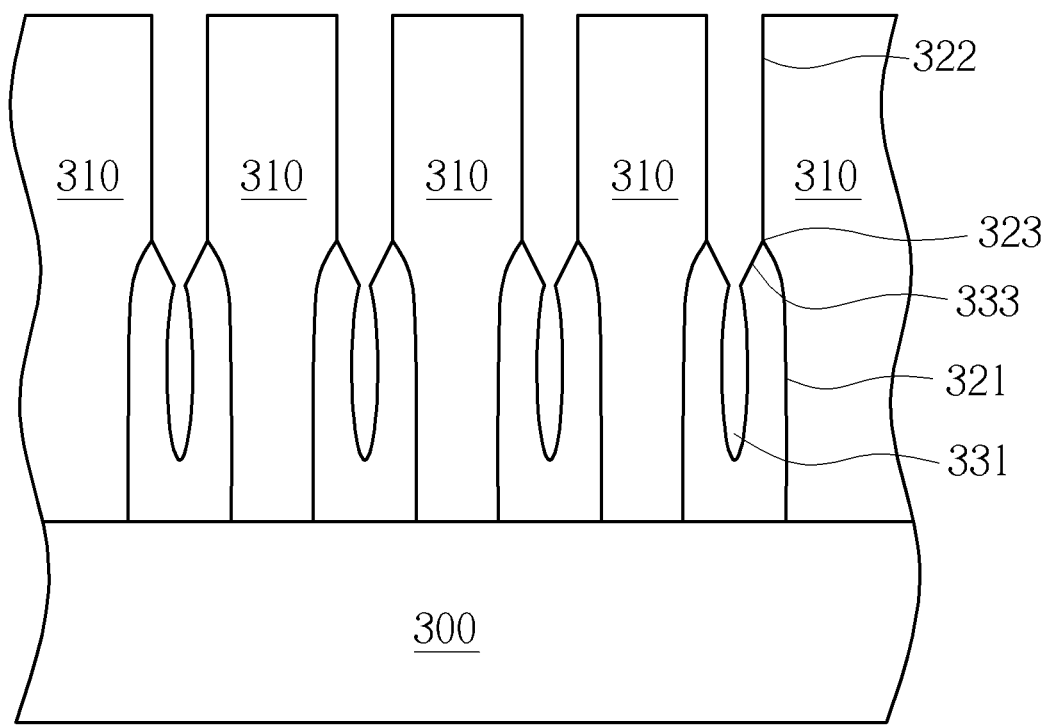

Then, a removing process is performed to partially remove the semiconductor layer 330. For example, the semiconductor layer 330 covered on the top surface of the dielectric layer 310 is completely removed, and the semiconductor layer 330 formed within the openings 320 is partially removed. In the present embodiment, the semiconductor layer 330 is removed till the top surface thereof being lowered to a half to one third of the depth of each opening 320, to expose the voids 331 in the bottom portion 321, as shown in FIG. 3. On the other hand, the removing process for example includes a dry etching process, and which may be accomplished by using a suitable etchant gas or a non-orthogonal plasma to etch the semiconductor layer 330, with the etchant gas or the non-orthogonal plasma preferably etching the semiconductor layer 330 through a V-shaped etching via an angle being about 10-45 degrees. Through this way, the etched semiconductor layer 330 may be in connection with the voids 331, so as to form a discontinuous top surface 333 being taped inwardly and downwardly at a half to one third of the depth of each opening 320, as shown in FIG. 3. Thus, the openings of the voids 333 may therefore obtain a greater dimension.

Figure 4:
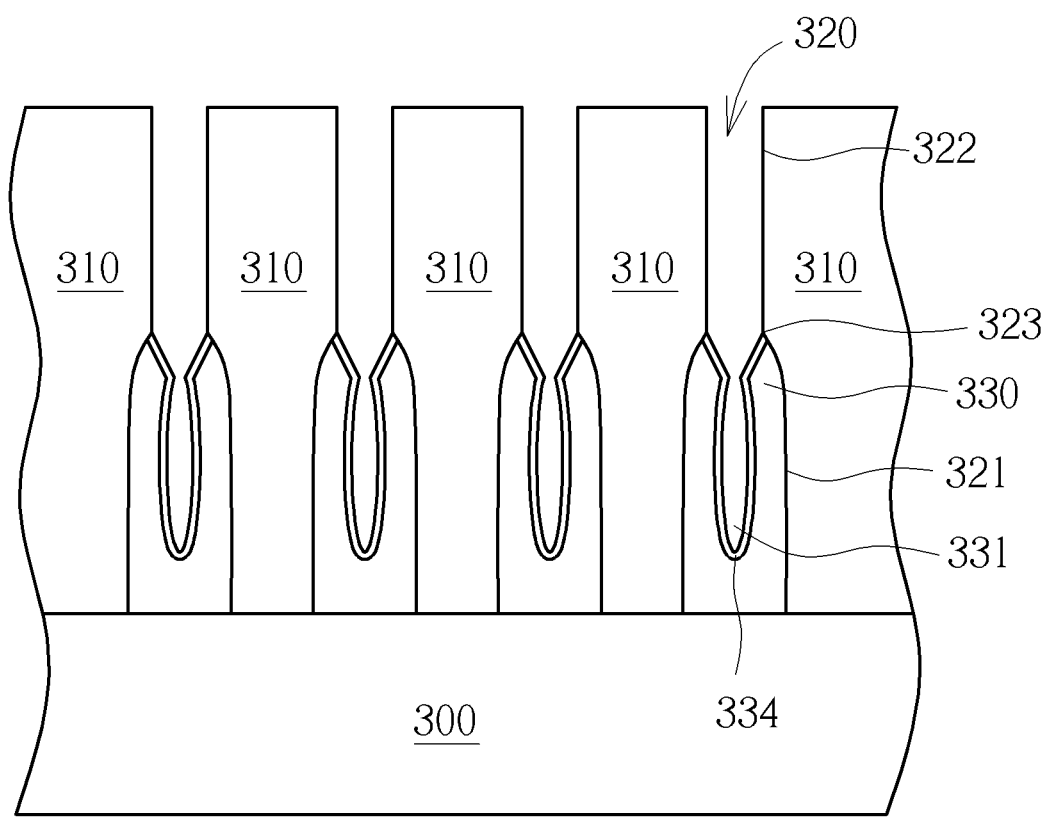
Figure 5:
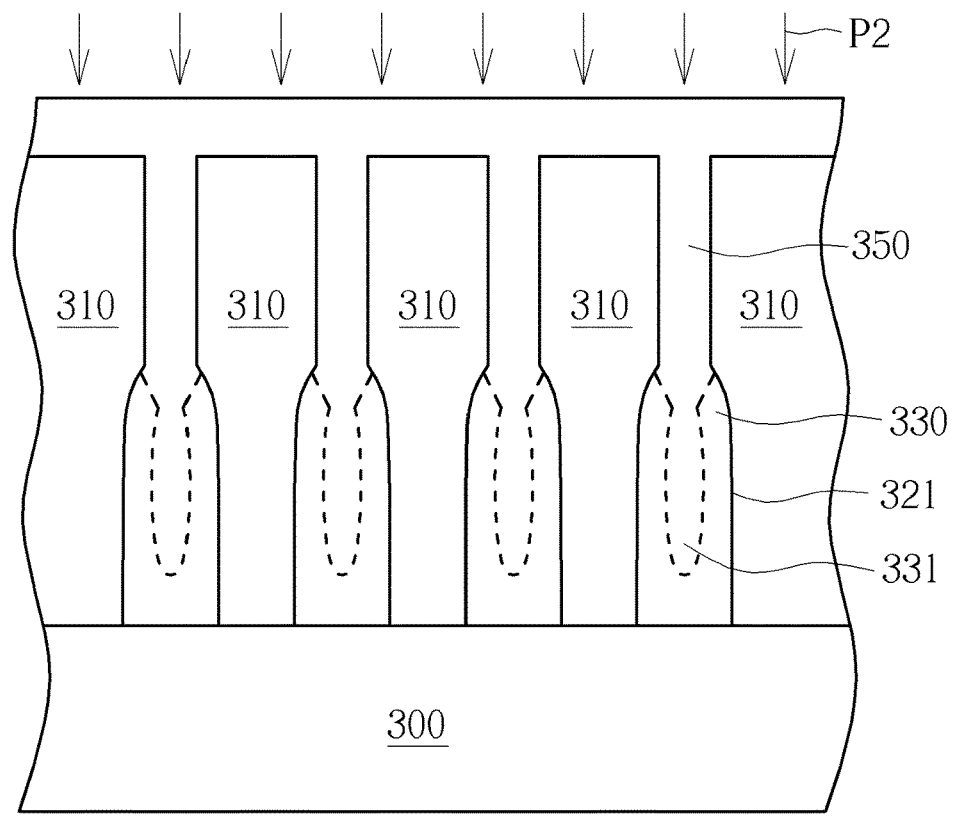

Following these, a protection layer 334 for example including silicon oxide ($SiO_x$) is formed on exposed surfaces of the etched semiconductor layer 330 as shown in FIG. 4, after the removing process, because the exposed surfaces of the etched semiconductor layer 330 may natural react with atmosphere in the environment. Then, an etching process such as a dry etching process or a wet etching is performed, to completely remove the protection layer 334, followed by performing another deposition process P2. Precisely speaking, the protection layer 334 is conformally formed on the surfaces of the etched semiconductor layer 330, so that, the openings of the voids 331 may be further expanded after completely removing the protection layer 334, as shown in FIG. 5. The deposition process P2 is for example performed via a LPCVD process, to form a semiconductor layer 350, such as including a semiconductor material like polysilicon or amorphous silicon, on the semiconductor layer 330. The semiconductor layer 350 is preferably formed through the same processes conditions as the formation of the semiconductor layer 330, so as to obtain the same material and features thereof. In the present embodiment, the reaction gas of the deposition process P2 may efficiently form the semiconductor layer 350 through the expanded voids 331, so as to make the semiconductor layer 350 to successfully fill the voids 331, the openings 320 and to further cover on the top surface of the dielectric layer 310, as shown in FIG. 5. In this way, the semiconductor layer 350 may achieve a better deposition in the deposition process P2, since the high aspect ratio issue of the openings 320 may be improved due to the semiconductor layer 330 formed in the bottom portion of the openings 320.

Through the above mentioned stepped, the forming method of the semiconductor device of a preferred embodiment of the present invention is accomplished. According to the method of the present embodiment, two-stepped deposition processes are performed on the openings 320 with a high aspect ratio. Also, a v-shaped etching is further performed after the first stepped deposition process, to partially remove the semiconductor layer 330 formed in the first stepped deposition process till the top surface of the etched semiconductor layer 330 being lowered to a half to one third of the depth of the openings 320, or till the transition portion 323 of the openings 320 being exposed. That is, the voids 332 formed in the upper portions of the openings 320 are removed, and the voids 331 formed in the bottom portions of the openings 320 will be exposed thereby. Then, the semiconductor layer 350 formed in the second stepped deposition process may fill the voids 331 and the openings 320 thereby. In this way, the forming method of the present invention enables to improve the void issues which are easy to be formed during a deposition process in openings with a high aspect ratio, and to provide semiconductor device with better performance.

Through the aforementioned embodiment, it is noted that the forming method of the present invention has advantages to performing a deposition process in openings with a high aspect ratio, and which may be practical applied to a semiconductor process, such as a process of forming a semiconductor memory device like a dynamic random access memory (DRAM) device, for forming a storage node (SN) therein.

Figure 6:
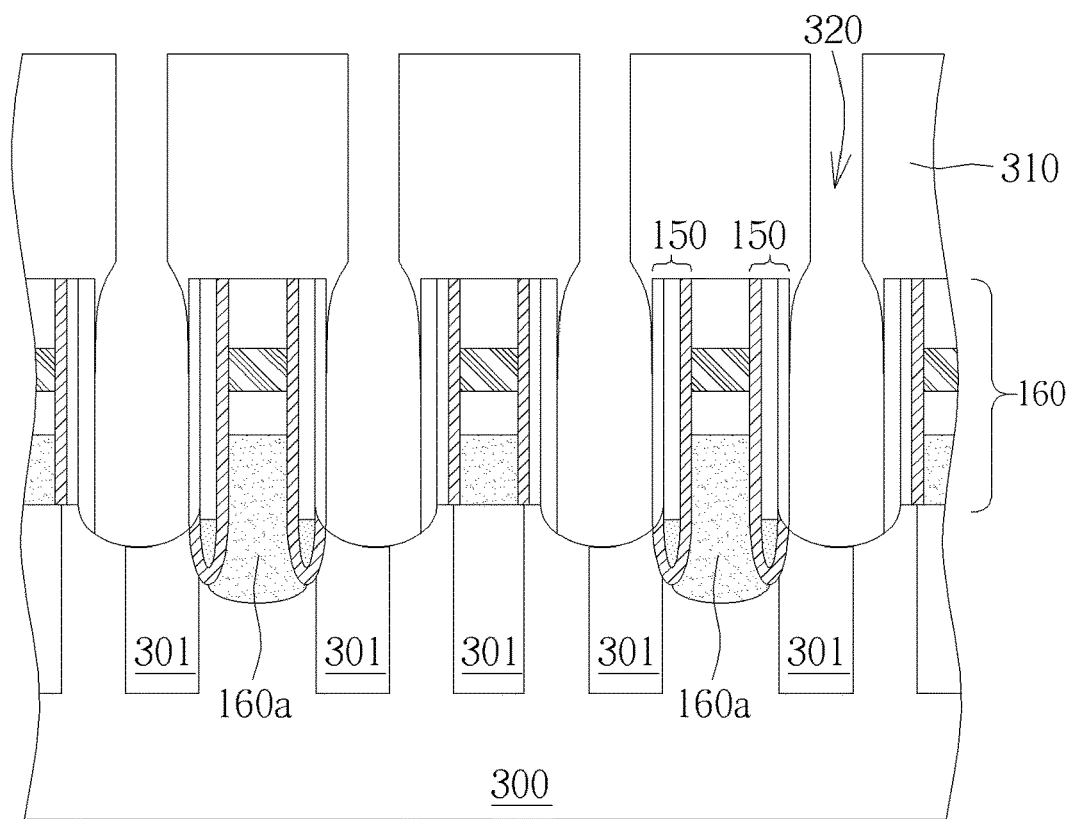
Figure 7:
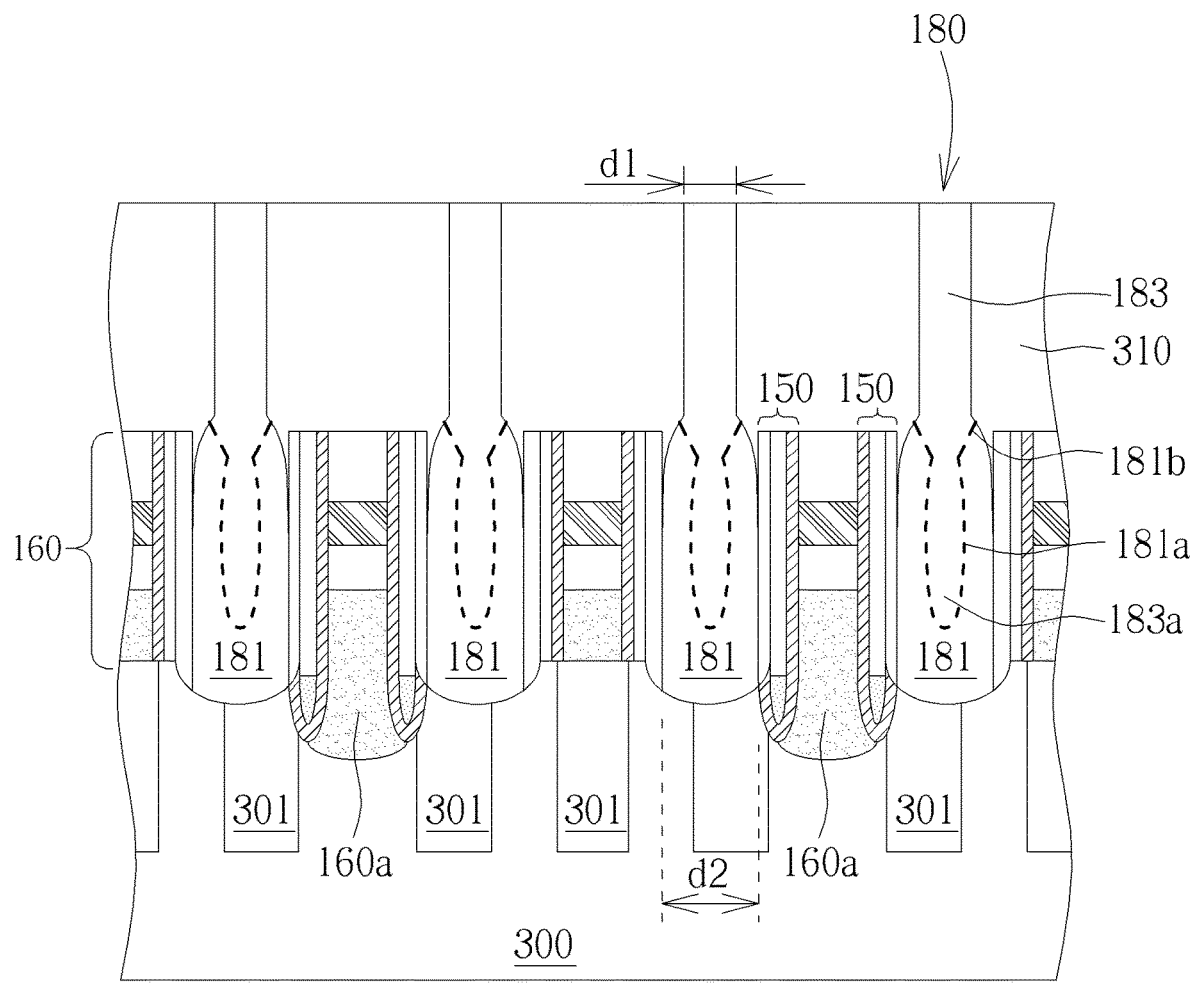

Precisely speaking, in an example of using the forming method of the present invention to form a DRAM device, the substrate 300 for example includes a semiconductor substrate, and a plurality of shallow trench isolations 301 is formed in the semiconductor substrate to define a plurality of active areas (not shown in the drawings). Also, a plurality of buried gate structures is formed in the semiconductor substrate to serve as buried word lines, and a plurality of bit lines (BLs) 160 and a plurality of plugs 180 are further formed in the dielectric layer 310 on the semiconductor substrate, as shown in FIG. 6 to FIG. 7.

Furthermore, a spacer structure 150 is further formed between each of the bit lines 160 and each of the plugs 180 for isolating the bit lines 160 and the plugs 180. It is noted that, the formation of the plugs 180 may be carried out after forming the bit lines 160 and the spacer structure 150, by firstly defining a plurality of openings 320 in the dielectric layer 310 as shown in FIG. 6, followed by forming the plugs 180 in the openings 320 through the aforementioned forming method in present invention, as shown in FIG. 7. Precisely speaking, each of the plugs 180 formed through the aforementioned forming method in present invention may include a bottom portion 181 having the relative greater dimension d1 and a top portion 183 having the relative smaller dimension d2, with the bottom portion having a bottle-shaped trench 181a disposed therein, and the opening 181b of the bottle-shaped trench 181a is continuously taped inwardly to the center thereof. The top portion 183 is disposed on the bottom portion 181 with a part 183a thereof being filled in the bottle-shaped trench 181a of the bottom portion 181, as shown in FIG. 7. In one embodiment, the top portion 183 and the bottom portion 181 may both include a semiconductor layer (as being formed through the semiconductor layers 330, 350 respectively) which may be in the same or different materials, like polysilicon or amorphous silicon, but not limited thereto.

That is, the structures of the plugs 180 formed accordingly may no longer be affected due to the high aspect ratio of the openings 320, so as to form the plugs 180 being consisted of uniformly and planar material layers. Then, each of the plugs 180 may further be electrically connected to a source/drain region (not shown in the drawings) of a transistor in the DRAM device through a silicide layer (not shown in the drawings) formed on the top surface of the substrate 300, to serve as a storage node contact (SNC). On the other hand, each of the bit lines 160 may be electrically connected to another source/drain region (not shown in the drawings) of the transistor in the DRAM device through a bit line gate (BLG) 160a disposed below the bit lines 160, to serve as the smallest unit in the DRAM array for accepting signals from bit lines 160 and the buried word lines (not shown in the drawings) during the operation. However, the practical application of the present invention is not limited to what is disclosed in the aforementioned embodiment, and may further include other semiconductor processes in other embodiment, for avoiding the formation of voids during performing a deposition process in openings with a high aspect ratio, to interfere with the normal functions and performances of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a dielectric layer disposed on the substrate;
   a plurality of bit lines disposed in the dielectric layer; and
   a plurality of plug disposed in the dielectric layer, being alternately arranged with the bit lines, wherein each of the plugs comprises a first semiconductor layer and a second semiconductor layer stacked sequentially, and the second semiconductor layer is partially surrounded by the first semiconductor layer.

2. The semiconductor device according to claim 1, wherein the first semiconductor layer has a larger diameter than that of the second semiconductor layer.

3. The semiconductor device according to claim 1, wherein the first semiconductor layer comprises a bottle-shaped trench and the second semiconductor layer is partially disposed in the bottle-shaped trench.

4. The semiconductor device according to claim 3, wherein the bottle-shaped trench comprises continuously taped sidewalls at an opening of the bottle-shaped trench, and a top of the opening is higher than a top surface of the bit lines.

5. The semiconductor device according to claim 3, wherein a bottommost surface of the bottle-shaped trench is lower than a top surface of a semiconductor layer of each of the bit lines.

6. The semiconductor device according to claim 3, wherein a bottommost surface of the bottle-shaped trench is higher than a top surface of the bit line contact disposed under the bit lines.

* * * * *